United States Patent

Kost et al.

[11] Patent Number: 6,081,215
[45] Date of Patent: Jun. 27, 2000

[54] HIGH SPEED INTERLACED ANALOG INTERFACE

[75] Inventors: Robert Roy Kost, Gilbert; Ronald Wayne Kassik, Scottsdale, both of Ariz.

[73] Assignee: Motorola, Inc., Schaumburg, Ill.

[21] Appl. No.: 09/110,308

[22] Filed: Jul. 6, 1998

[51] Int. Cl.[7] .................................................. H03M 1/10
[52] U.S. Cl. ...................... 341/120; 341/118; 341/126; 341/139; 341/141
[58] Field of Search .................................. 341/118, 120, 341/126, 139, 141

[56] References Cited

U.S. PATENT DOCUMENTS

| | | | |
|---|---|---|---|
| 4,962,380 | 10/1990 | Meadows | 341/120 |
| 4,968,988 | 11/1990 | Miki et al. | 341/141 |
| 5,239,299 | 8/1993 | Apple et al. | 341/118 |
| 5,294,926 | 3/1994 | Corcoran | 341/120 |
| 5,465,098 | 11/1995 | Mayes et al. | 341/118 |

*Primary Examiner*—Brian Young
*Assistant Examiner*—Jason L W Kost
*Attorney, Agent, or Firm*—Bradley J. Botsch

[57] ABSTRACT

An apparatus for wide bandwidth analog to digital and digital to analog signal conversion is disclosed. An input/output stage (40) is coupled to an external analog system and includes reference voltages for calibration of the analog to digital (A/D) conversion process. A conversion stage (46), comprising a plurality of A/D converters (ADC) (48, 50) and a digital to analog converter (52), is coupled to the input/output stage and to a digital signal conditioning stage (54) which is coupled to an external digital system. Offset and gain errors in the outputs of each ADC are corrected by the application of appropriate correction parameters in the digital signal conditioning stage. The sampling intervals for each ADC are phased to allow the digital outputs of the ADCs to be interleaved and form a resulting digital data stream with a sampling rate a multiple of that of any one ADC.

22 Claims, 6 Drawing Sheets

FIG. 1 —PRIOR ART—

HIGH SPEED INTERLACED ANALOG INTERFACE

FIELD OF THE INVENTION

This invention relates in general to the field of analog to digital signal conversion, and in particular to conversion of wide bandwidth analog signals to a digital data stream. Specifically, the present invention relates to increasing the sampling rate and thus the bandwidth of analog to digital conversion by using a plurality of commercially available analog to digital converter components, correcting for offset and gain errors in these components by digital signal processing, and then interlacing their outputs.

BACKGROUND OF THE INVENTION

In the processing of communication signals there is a need to convert the received signal from analog to digital form as early as possible in the processing of the signal to allow the use of sophisticated filtering, demodulation and other processing tasks that are better accomplished in the digital domain. This need places requirements on the analog to digital interface to have an input bandwidth substantially equal to that of the received signal, to have a dynamic range sufficient to accommodate the expected amplitude variability of the received signal, and to not substantially increase the noise or spurious signal content of the resulting digital signal.

The sampling frequency used in the analog to digital conversion process is related to the analog signal bandwidth by the Nyquist rate well known to those skilled in the art. If a signal is band limited to a bandwidth, W, it can be substantially reproduced in digital form if it is sampled at a rate, $F_s$, where $F_s \geq 2$ W. Generally, some level of over sampling is used with $F_s$ being one and one half or more times the minimum sampling rate.

Single component or similar configuration analog to digital converters are commercially available. However, these devices generally do not have sufficiently high sampling rate capability to meet the wide bandwidth requirements desired in communication systems. An intrinsic design characteristic is that devices with greater dynamic range are more limited in sampling rate and consume a larger amount of power. In the past a variety of schemes have been developed to combine two or more analog to digital converter (ADC) components to achieve the desired increase in bandwidth but the resulting design must include methods to eliminate variations in ADC device parameters. These components exhibit small but finite variations from device to device in gain, linearity, and the offset of the output at zero signal input, as well as shifts in these parameters due to changes in ambient temperature and aging. Compensation for these variations must be accomplished before the digital signals from a plurality of these components are interlaced to form a single output.

An ADC should demonstrate a linear relationship between the amplitude of the analog input and that of the digital output. The digital output should also faithfully reproduce the polarity of the analog input. This relationship can be described by the well known mathematical description of a straight line.

$$Y = m \times X + b$$

where: Y represents the digital output, X represents the analog input, m represents the gain of the transfer function, and b is the offset error in the output with zero as the analog input. Typical commercially available ADCs exhibit some small device to device variations in the value of m and exhibit small but finite values for b. Further, such ADCs may exhibit some non-linearity in the transfer function which can be expressed by the addition of higher order $X^2$, $X^3$, etc., terms to the equation. If a plurality of ADCs are combined without compensation for device to device differences, substantial degradation in the dynamic range of the multi-ADC system will occur. For example, if at zero volts analog input one ADC generates a digital output of plus one last significant bit (LSB), the other ADC output is minus one LSB, and these errors were not compensated for, the total dynamic range of the concatenated ADC outputs would be reduced by two bits or 12 dB. Differences in gain and non-linearities from ADC to ADC must also be removed to prevent the introduction of significant spurious signals into the resulting digital data stream.

FIG. 1 shows an example of a prior art wideband analog to digital (A/D) conversion system, using commercially available converter components, which comprises an input stage 10, a gain and offset adjustment stage 16, a conversion stage 30, and a processor stage 38. The system receives wideband analog signals 11 and supplies their digital equivalent to associated digital signal processing circuits (not shown) via the digital interface 39.

The input stage 10 comprises a switching array and a reference voltage source 12 for calibrating the system, and an antialiasing filter 14. In response to control inputs 37 from the processor stage 38, the switching array selects either the analog input 11, an analog ground reference, or the reference voltage as the signal 15 to be sent to the antialiasing filter 14. The reference voltage source provides a substantially constant value voltage to be used for calibrating the A/D conversion system. The prior art example shown in FIG. 1 is intended to produce the digital equivalent of analog signals within a bandwidth of 0 to 40 MHz. The purpose of the antialiasing filter is to substantially remove from its input signal 15 any signal components outside that bandwidth before supplying the band limited signal 17 to the following gain and offset adjustment stage 16.

The gain and offset adjustment stage 16 comprises two identical channels. The first channel shown in FIG. 1 comprises a substantially linear operational amplifier 18 capable of receiving gain and offset adjustments, and two DACs 20 and 22 which provide the gain and offset adjustment control voltages. The output 21 of the channel is a faithful reproduction of the input signal 17 with the exception that the amplitude differs in accordance with the gain adjustment and its zero reference is offset in accordance with the offset control voltage. Operational amplifier 24 and DACs 26 and 28 make up the second channel of the gain and offset adjustment stage 16 and function in the same manner as components 18, 20 and 22, respectively, of the first channel.

Conversion stage 30 comprises two commercially available ADC components 32 and 34. In the prior art example of FIG. 1, the ADC components are assumed to have the capability to operate at a sampling rate of 60 megasamples per second or less, and to produce a 10 bit digital output representing the amplitude of each input sample. The two ADCs are supplied from the processor stage 38 clock signals with a phase relationship of 180 degrees at a frequency of 60 MHz. The combination of the two ADCs and the phasing of the clock signals results in an effective sampling rate of 120 MHz when the ADC outputs are interleaved.

The processor stage 38 comprises either an application specific integrated circuit or simply part of the resources of the host processor to which this A/D interface is attached.

Functions performed by processor stage 38 comprise (1) control of the switching array 12 in the input stage 10, (2) computation of the gain and offset error control signals 25 and 27 and their subsequent supply to the DACs 20, 22, 26 and 28 in the gain and offset adjustment stage 16, (3) generation of sampling clock signals, the proper phasing of these signals, and the transmission of these clock signals to ADCs 32 and 34 by way of digital busses 29 and 31, (4) the reception of the signal samples in digital form from ADCs 32 and 34 by way of digital busses 29 and 31, and their concatenation into a single digital data stream, and (5) the filtering of the interlaced data stream to significantly reduce noise and spurious signal components introduced into the data by the conversion process.

The offset error portion of the control signals 25 and 27 are computed by the process of commanding the switching array 12 to switch the antialiasing filter input 15 to the analog ground reference. The resulting digital signal outputs of the ADCs on digital busses 29 and 31 are compared with the expected output for a zero input, error signals are generated for each ADC that will result in their outputs equaling zero inputs, and these error signals are stored and then supplied to DACs 20 and 26 during the conversion of analog input signals. In a similar manner the gain correction portion of the control signals 25 and 27 are computed by commanding the switching array 12 to provide an appropriate known value reference voltage to the antialiasing filter input 15. The resulting digital signal outputs of the ADCs are compared to expected outputs for this voltage, gain correction signals for each converter are generated which result in their output having the proper value for the reference voltage input, and these gain correction signals are stored and supplied to DACs 22 and 28 for use during analog to digital signal conversion.

Difficulties with the prior art arrangement shown in FIG. 1 are that it introduces an extra stage, gain and offset adjustment stage 16, in the analog signal path which adds its own errors into the analog signals being processed. Also, gain and offset adjustment stage 16 adds the relatively significant expense of the highly linear operational amplifiers 18 and 24, and the four DACs 20, 22, 26, and 28. The prior art configuration can only correct for gain at one reference point; it cannot correct for non-linearities in the combined transfer functions of the linear operational amplifiers 18 and 24, and the ADCs 32 and 34.

Hence, what is needed is an improved apparatus and method for compensating offset and gain errors in combined ADCs.

BRIEF DESCRIPTION OF THE DRAWINGS

A more complete understanding of the present invention may be derived by reference to the detailed description and the claims when considered in connection with the accompanying drawings in which like reference numbers represent similar parts, and wherein:

DETAILED OF THE DRAWINGS

Figure 1:
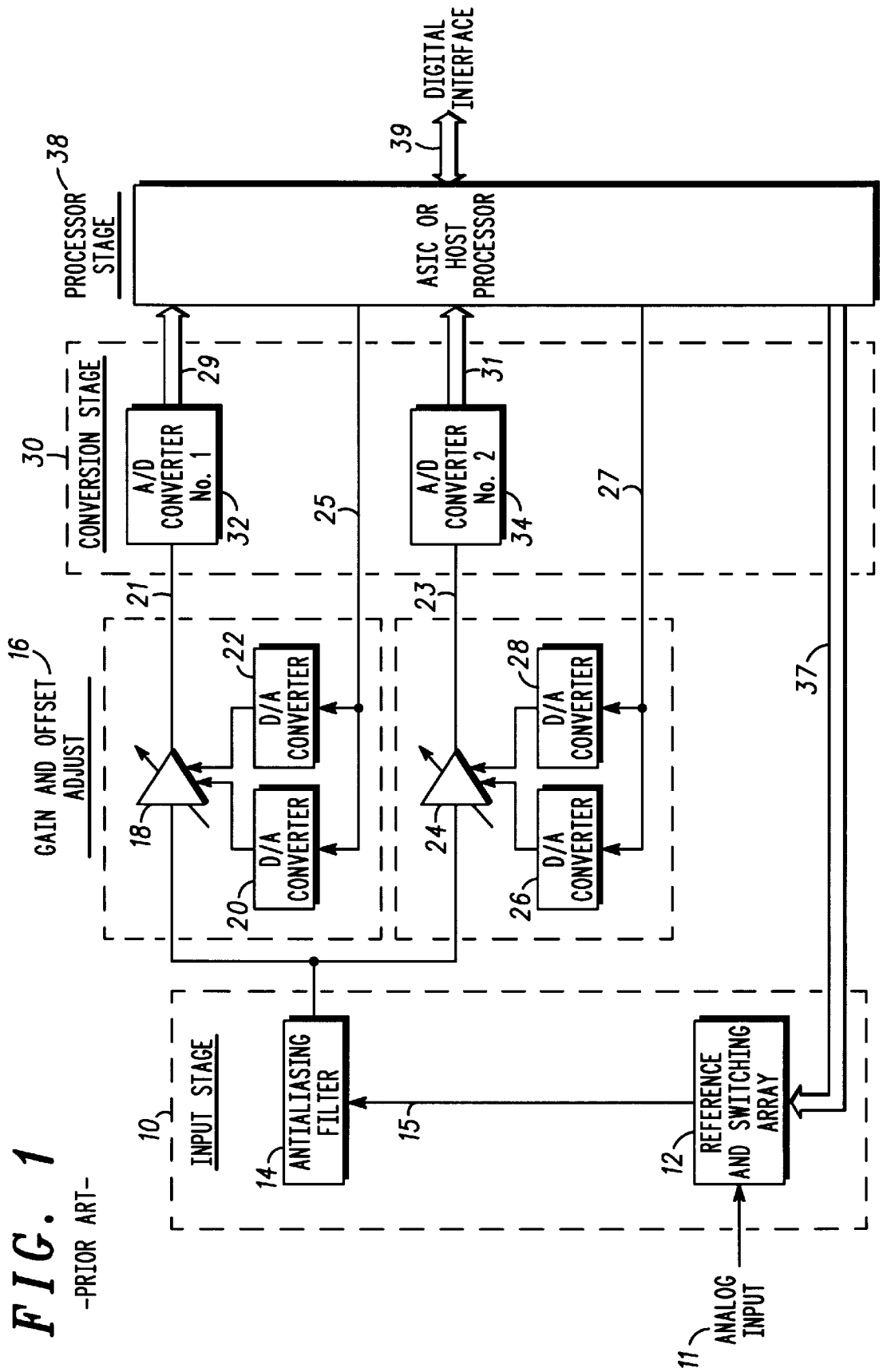
FIG. 1 depicts a simplified block diagram of a prior art A/D converter system.

Accordingly, the present invention provides a new and improved method for the compensation of offset and gain errors in a wideband A/D interface which uses a plurality of converter components with interlaced outputs. It is an advantage of the present invention that it performs the necessary gain and offset adjustments after the signals have been converted to digital format, making it less expensive to produce since no analog gain and offset adjustment stage with attendant linear operational amplifiers and DACs are required. It is also an advantage of the present invention that elimination of the gain and offset adjustment stage used in prior art also eliminates the power consumption of that stage. It is a further advantage of the present invention that non-linearities introduced by the prior art operational amplifiers are eliminated. Still another advantage of the present invention is that independent corrections can be made for non-linearities in the A/D conversion transfer functions for each of the plurality of ADCs used. An additional advantage of the present invention is that the corrections for offset, gain and non-linearities can be made to a precision that is equal to the precision of the A/D conversion process. In addition to the analog to digital conversion, the present invention provides a means of digital to analog conversion to complete the two way interface between the analog and digital domains. The analog domain comprises all circuitry to which the present invention interfaces wherein all signals are predominantly analog in nature, while the digital domain comprises all circuitry and digital signal processing functions to which the present invention interfaces wherein all signals are predominently digital in nature.

The above and other advantages of the present invention are carried out in one form by a system comprising an input/output stage, a conversion stage and a digital signal conditioning stage. The input/output stage includes means for switching between an input analog signal from an external system, an analog signal to be output to said external system, and a plurality of reference voltage sources for calibration of the A/D conversion process. The input/out stage also includes an antialiasing filter to substantially limit the bandwidth of the input analog signal to that equal to or less than the requirements of the Nyquist criterion. The conversion stage includes a plurality of ADC components which process the analog output of the antialiasing filter and produce the digital equivalent. The conversion stage also includes a DAC component to supply to the input/output stage the analog equivalent of a digital signal. An offset, gain and linearity error measuring means in the digital signal conditioning stage examines the digital output of the ADCs when each of the reference voltages is successively input to the antialiasing filter and subsequently to the converters, and computes appropriate correction parameters to substantially eliminate the errors. The digital signal conditioning stage also includes sum and multiplication computational means to apply the correction parameters to the output data streams from the ADCs when an analog signal is received by the input/output stage. In addition, the digital signal conditioning stage includes means to generate and supply to the ADCs a plurality of timing signals which determine the sampling intervals for each converter. The phasing of the timing signals are determined to allow the digital outputs of the converters to be interleaved and form a resulting digital data stream with a sampling rate a multiple of the sampling rate of any one converter. Those skilled in the art will recognize that two ADCs controlled by clock signals phased 180 degrees with respect to each other will double the effective sampling rate and thus the allow conversion of analog signals with twice the bandwidth as can be processed by a single converter. The use of four converters will quadruple the effective sampling rate and bandwidth. Finally, the digital signal conditioning stage includes concatenation means to interleave the digital signals from the ADCs, and a filter to substantially remove any noise and spurious signal components caused by the conversion process and introduced into the final digital data stream.

Figure 2:
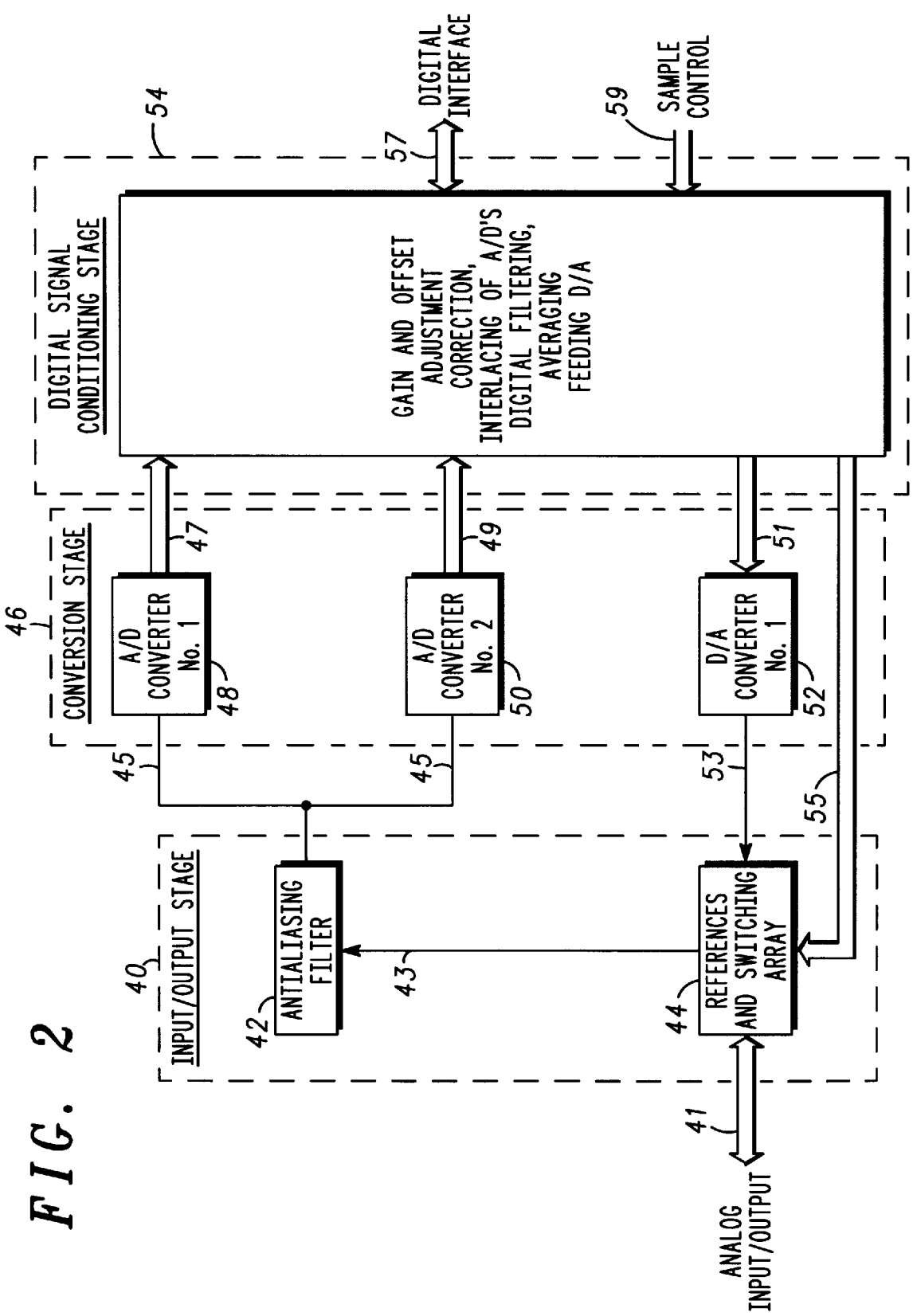
FIG. 2 shows a simplified block diagram of an A/D and D/A converter system in accordance with the preferred embodiment of the present invention.

A high sampling rate, and thus wide bandwidth, A/D and D/A interface system is illustrated in block diagram form in FIG. 2 in accordance with the preferred embodiment of the present invention. Major components include an input/output stage 40, a conversion stage 46, and a digital signal conditioning stage 54. The construction and operation of the input/output stage 40 has similarities to that discussed in connection with the prior art input stage 10 of FIG. 1, with the exceptions that it can also provide an analog output signal to the interfacing analog domain, and the references and switching array 44 of FIG. 2 in the present invention includes a greater number of voltage references with a switch element associated with each voltage. Details of the input/out stage of the present invention are provided in FIG. 3. The construction and operation of the conversion stage 46 of FIG. 2 is similar to that discussed in connection with the prior art conversion stage 30 of FIG. 1, with the addition of a D/A converter and associated interconnections. The digital signal conditioning stage 54 comprises a field programmable gate array (FPGA) device, a digital signal processor (DSP) and associated digital circuitry. Digital signal conditioning stage 54 performs the necessary activities of calibration, offset and gain adjustments, interleaving of the ADC outputs, and filtering of the resulting digital data stream. Although the preferred embodiment uses a FPGA device to accomplish the gain and offset correction, interlacing of ADC outputs, and filtering of the resulting digital data stream in the digital signal conditioning stage 54, the present invention is not limited in scope to the use of these devices. Those skilled in the art will recognize that any digital signal processing apparatus of equivalent capability may be used in place of the FPGA, with one example being a complex programmable logic device (CPLD). FIG. 4 provides a block diagram of the major functional elements implemented in the conversion stage 46 and the digital signal conditioning stage 54.

In FIG. 2, the analog input/output 41 comprises the interface connections for wideband analog signals received from and supplied to associated analog circuits (not shown). The digital interface 57 conveys the digital equivalent of the received analog signal to the associated digital processing system (not shown), and receives a digital data stream for conversion to analog format and transfer to the associated analog circuits via analog input/output 41. Sample control 59 comprises a clock signal and input/output control signals as required by the associated digital processing system to control the operation of the A/D and D/A interface. The elements of sample control 59 depend upon the particular processing scheme of the associated digital signal processing system.

Figure 3:
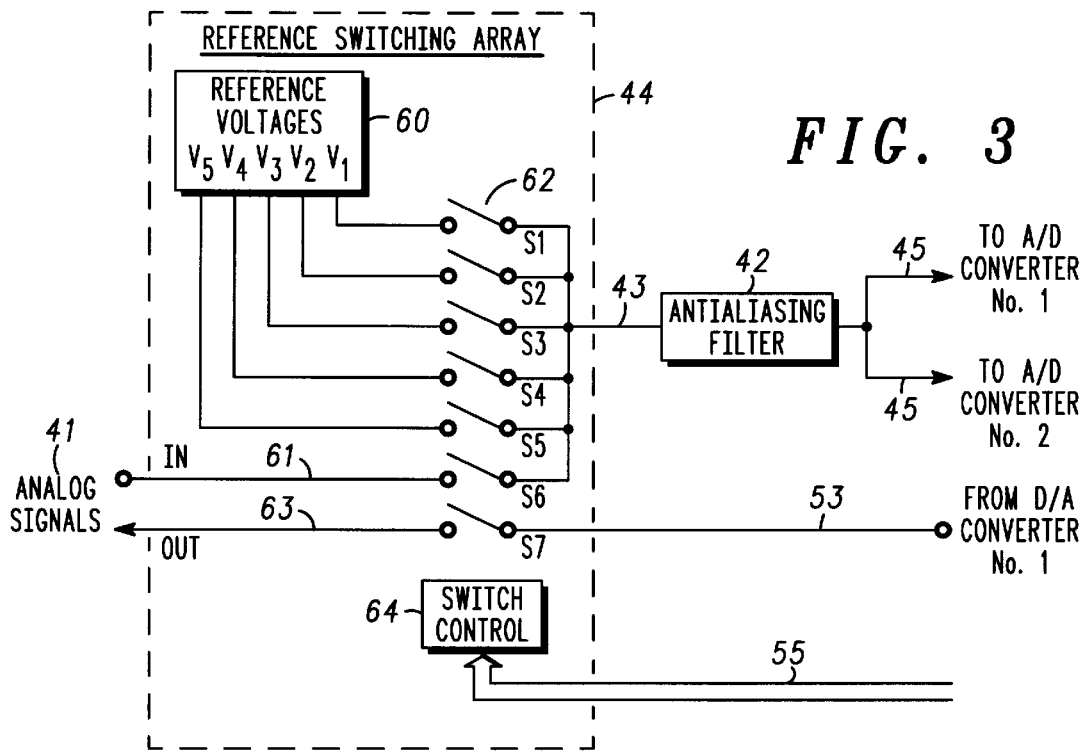
FIG. 3 is a more detailed block diagram of the input/output stage of FIG. 2.
Figure 4:
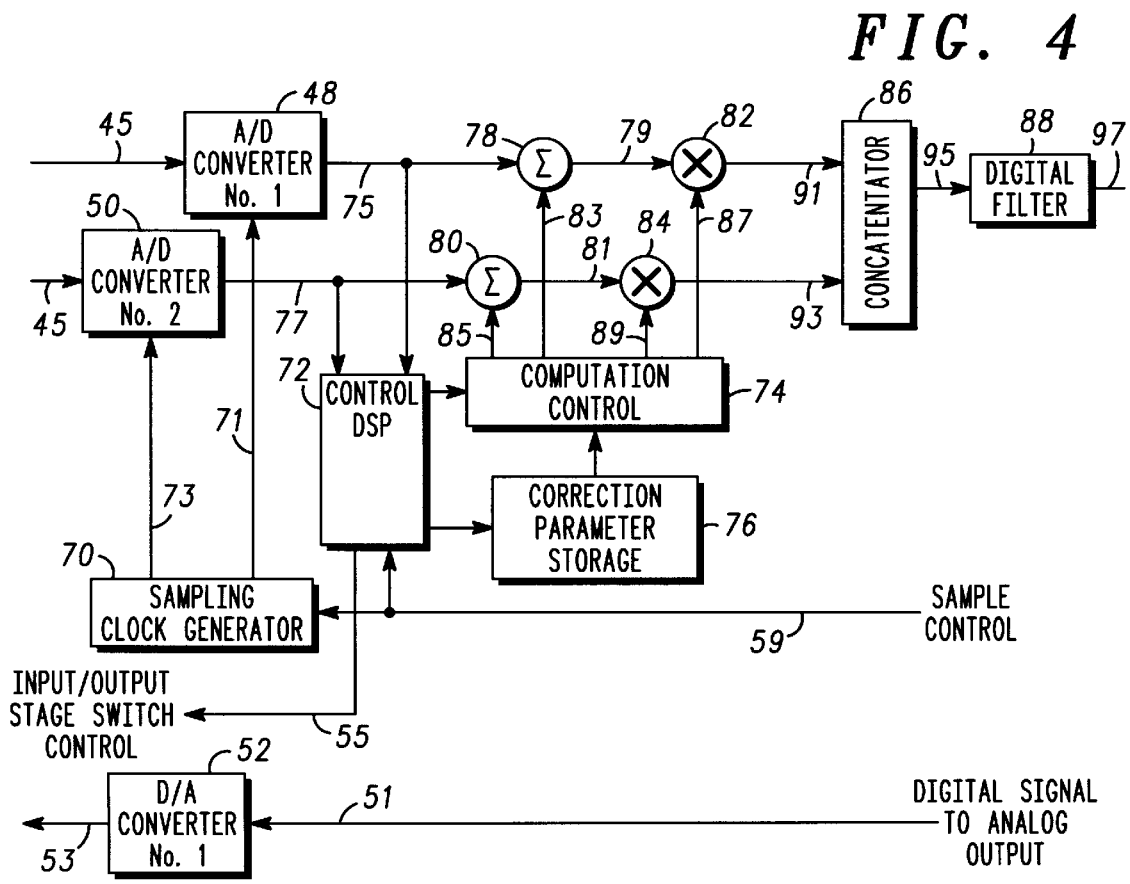
FIG. 4 is a more detailed block diagram of both the conversion stage and the digital signal conditioning stage of FIG. 2.

Reference voltages circuitry 60 in the references and switching array 44 of FIG. 3 produce four substantially constant value voltages, $V_2$ through $V_5$, used for calibrating the A/D conversion system. Reference voltage $V_1$ has a value substantially equal to zero volts and constitutes the analog input ground. In the preferred embodiment of the present invention the ADC devices 48 and 50 have an analog input voltage range from $-V_{Max}$ to $+V_{Max}$. A value for $V_{Max}$ of 1.0 volt is contemplated in a preferred embodiment. The values for the references voltages are:

$V_2 = -0.8 \times V_{Max}$
$V_3 = -0.4 \times V_{Max}$
$V_4 = +0.4 \times V_{Max}$
$V_5 = +0.8 \times V_{Max}$ This range of calibration reference voltages allows determination of and correction for both gain variations and non-linearities in the ADC devices. Those skilled in the art will recognize that more or fewer calibration reference voltages, and/or different values relative to $V_{Max}$ can be employed with attendant variations in the precision of the corrections.

Switch control 64 in FIG. 3 receives commands 55 from the digital signal conditioning stage 54 of FIG. 2, and in response closes the selected switch of the switch array 62. Only one switch in switch array 62 is closed at any one time. The closing of a switch in the group $S_1$ through $S_5$ connects the corresponding references voltage, $V_1$ through $V_5$ by way of switch output 43 to the antialiasing filter 42 and thus to the ADC device inputs by way of paths 45. Closing of switch $S_6$ supplies an analog input signal 61 from an external source to the antialiasing filter 42. The depicted arrangement of switch array 62 and antialiasing filter 42 provides the same path for a reference voltage as for an input analog signal through the antialiasing filter 42 to the ADCs 48 and 50.

The present invention possesses an analog output mode in which a digital data stream is supplied to the digital signal conditioning stage 54 by way of digital interface 57, and is further conveyed to the DAC 52 through data interface 51. The DAC 52 converts this digital data stream to a substantially equivalent analog signal 53 and supplies it to the switch array 62. When the appropriate command 55 is received by the switch control 64, switch $S_7$ is closed and the switched analog signal 63 is supplied to the associated analog circuits.

The antialiasing filter 42 significantly attenuates any components of its input signal 43 that fall outside the desired signal bandwidth defined by the Nyquist criterion and the chosen ADC sampling rate. For purposes of teaching the preferred embodiment of the present invention, the A/D interface is envisioned to be capable of producing the digital equivalent of analog signals within a bandwidth of 0 to 50 MHz. The antialiasing filter substantially removes from its output signal 45 any input signal components which fall outside that bandwidth. The methods for the design and construction of an antialiasing filter are well known to those skilled in the art.

FIG. 4 provides a block diagram of the major functional elements implemented in the conversion stage 46 and the digital signal conditioning stage 54 of FIG. 2. Sample control 59 comprises a clock signal and input/output control signals supplied by the associated digital processing system to control the operation of the A/D and D/A interface. The preferred embodiment of the present invention is envisioned to operate with an 80 MHz clock signal. Sampling clock generator 70 receives the clock signal, produces two replicas which are phased at 180 degrees with respect to each other, and provides hem as sampling clock signals 71 and 73 to ADCs 48 and 50. Sampling clock signals 71 and 73 may be interrupted by sample control 59 at times when a digital signal 51 is to be converted to analog form 53 by DAC 52 and sent to the associated analog circuits.

In the preferred embodiment, ADCs 48 and 50 are capable of operating at a clock rate of 80 MHz, and produce a parallel, 10 bit digital data output for 60 dB of dynamic range. ADCs 48 and 50 receive the bandlimited analog signal 45 from the antialiasing filter 42, sample this analog signal at a rate and phasing defined by sampling clock signals 71 and 73, and produce digital outputs 75 and 77.

Figure 5:
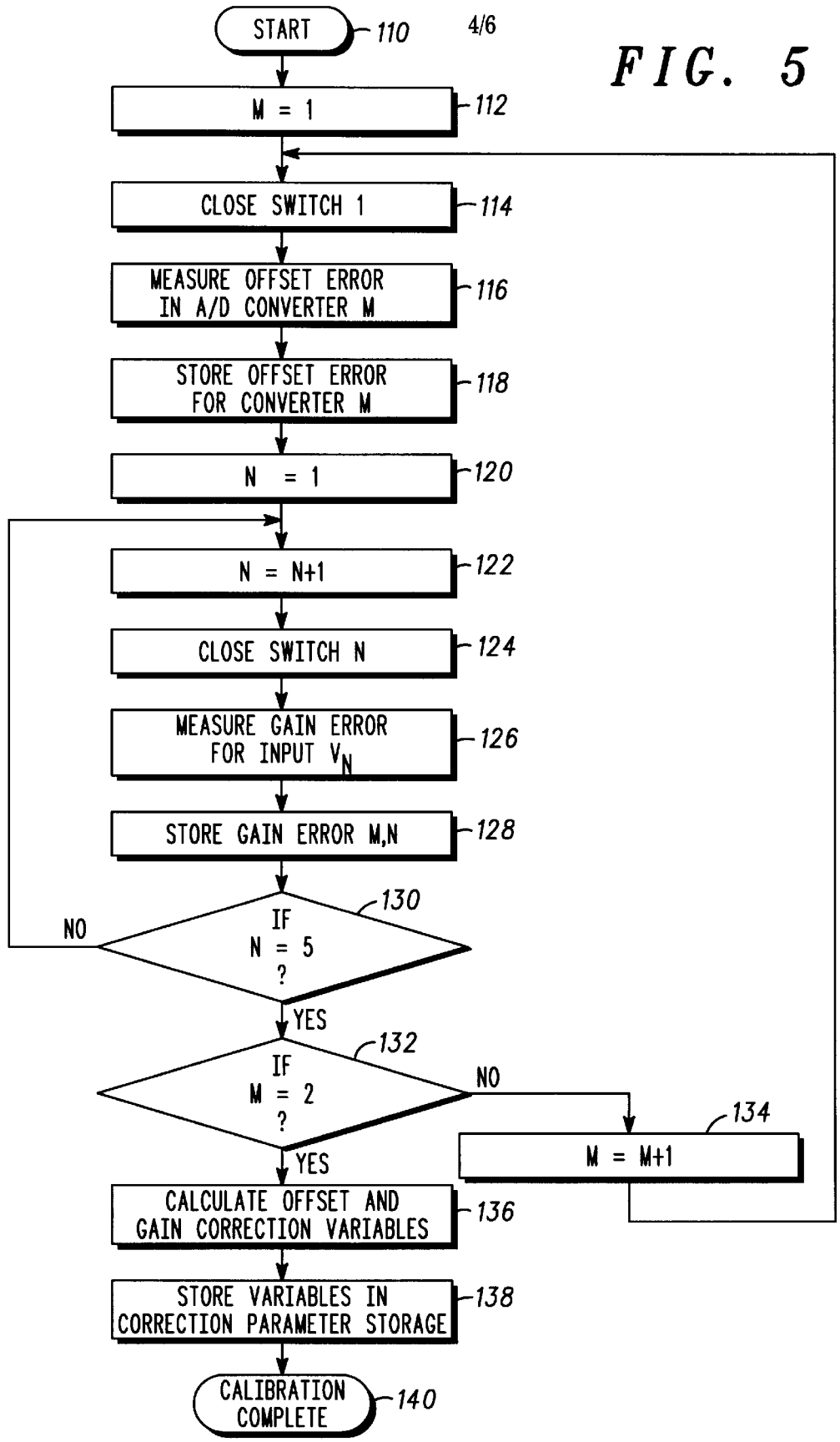
FIG. 5 shows a flow chart of a calibration method used in accordance with the present invention.

When commanded by the associated digital processing system by way of sample control 59 to perform calibration of the A/D interface, the control digital signal processor (DSP) 72 sends appropriate switch control signals 55 to the input/output stage 40 and commands that the known reference voltages, $V_1$ through $V_5$, be sequentially supplied to the input of the antialiasing filter 42. ADCs 48 and 50 produce outputs that are the digital equivalents of the supplied reference voltage but also include some errors introduced as an undesired consequence of the conversion processes. These errors are unique to each ADC, and may vary with device aging and changes in the environment. Control DSP 72 evaluates each these digital signals from each ADC and for each reference voltage by comparing them with the ideal values that would occur for an ADC with zero offset, linear input to output response and a defined gain. Control DSP 72 then determines the appropriate correction parameters which, when applied to the digital outputs of ADCs 48 and 50, will substantially remove the aforementioned errors. The precision, in terms on number of bits, of these correction parameters is equal to that of the ADC outputs, being 10 bits in the preferred embodiment. At the conclusion of the calibration sequence, the resulting correction parameters are stored in correction parameter storage block 76. Calibration is repeated periodically, ideally at times when no input or output of signals are required. FIG. 5 provides details of the steps in the calibration process.

Conversion of incoming analog signals to digital form occurs in response to a command from the associated digital processing system by way of sample control 59. Control DSP 72 sends the appropriate switch control signal 55 to the input/output stage 40 and commands that the analog input signal 61 be selected. As a result, digital data streams 75 and 77 are generated comprising the digital equivalents of the input analog signal 61 sampled at phased intervals defined by clock signals 71 and 73, and errors introduced as an undesired consequence of the device characteristics and conversion processes. Control DSP 72 then commands the computation control block 74 to make corrections to the digital data streams 75 and 77 by means of the digital offset and gain adjustment adders and multipliers which comprise two identical channels. The first channel comprises digital adder 78 and digital multiplier 82 with their corresponding inputs from the computation control 74. Digital adder 78 processes each sample of input data stream 75 by algebraically adding it with offset correction parameter 83, which is the current offset correction data for ADC 48 stored in the correction parameter storage block 76. The result is offset corrected signal 79 which in turn is supplied as one input to digital multiplier 82. Control DSP 72 evaluates each clocked sample in the ADC 48 output digital data stream 75, and determines its polarity and amplitude range. Then, the appropriate ADC 48 unique gain correction parameter, that originated from a calibration voltage in the same polarity and amplitude range, is selected from the correction parameter storage block 76 and supplied as gain correction parameter 87 to digital multiplier 82. The result of multiplication of the offset corrected signal 79 by the gain correction parameter 87 is offset and gain corrected signal 91 which is supplied as one input to the concatenator 86. Digital adder 80 and multiplier 84, and their associated signals make up the second digital offset and gain correction channel and function in the same manner as components 78 and 82, respectively, of the first channel.

Concatenator 86 interleaves the offset and gain corrected digital data streams 91 and 93 to form composite data stream 95 which has twice the sampling rate and thus twice the bandwidth of either of the individual data streams from which it is constructed. For the preferred embodiment of the present invention the composite sampling rate is 160 megasamples per second, adequately exceeding the Nyquist criterion requirement for analog input signals within a 50 MHz bandwidth. Digital filter 88 substantially removes any noise and spurious signal components introduced by the conversion process, and provides the filtered digital data stream 97 to the associated digital processing system. The methods for the design and construction of digital filter 88 are well known to those skilled in the art.

The preferred embodiment depicted in FIG. 2 features two ADCs 48 and 50 which result in an effective doubling of the sampling rate of the incoming analog signal. Those skilled in the art will recognize that a plurality of ADCs greater than two, accompanied by appropriate phasing of the sampling clock signals to each ADC, can be used to further increase the effective sampling rate of the system. Further, the preferred embodiment envisions the use of ADCs with a dynamic range of 10 bits and maximum individual sampling at a 80 MHz clock rate. Those skilled in the art will recognize that other combinations of clock rate, dynamic range, and number of ADCs fall within the scope of this invention.

FIG. 5 is a flow chart illustrating the steps required for calibration of the A/D conversion system to remove the differences in offset and gain among the ADCs. The calibration process provides for the calibration of a plurality of ADCs, the number of ADCs being equal to M. It also provides for the use of N different reference voltages. The preferred embodiment has M=two ADCs and N=five reference voltages. The calibration process begins with box 110 which represents the receipt of a start calibrate command from the associated digital processing system. In box 112, the M counter is initialized to a value of 1. In box 114, switch $S_1$ is closed connecting the input of the ADCs to analog ground, designated as reference voltage $V_1$, via the antialiasing filter. The $ADC_M$ output in the form of a digital voltage $DV_{M1}$ with zero input is measured in box 116. In box 118 the offset correction parameter $OC_M$ for $ADC_M$ is computed by simply defining the negative value of $DV_{M1}$ and stored in correction parameter storage as illustrated in box 120. Offset correction parameter $OC_M$ is typically very much smaller than $V_{Max}$. In box 122, the N counter is initialized to 1 and then incremented by 1 in box 124. Box 126 illustrates the command to close switch $S_N$, thus connecting analog reference voltage $V_N$ to the input of $ADC_M$ and allowing the measurement of the digital voltage $DV_{M,N}$ at input reference voltage $V_N$ as illustrated in box 128. The result of this measurement is used in box 130 to calculate the gain correction parameter $GC_{M,N}$ by dividing the term $(DV_{M,N}+OC_M)$ into the digital reference voltage $R_N$, which is the digital equivalent of the analog reference voltage $V_N$. Gain correction parameter $GC_{M,N}$ has a value of $1\pm e$, where e is a positive or negative gain error of value much less than 1. This gain correction parameter is then stored in correction parameter storage in box 132.

The calibration sequence then proceeds to box 134 where a test is made to determine if all reference voltages have been used for calibrating $ADC_M$. If N is not equal to its maximum value, which is 5 for the preferred embodiment of the present invention, the process loops back to box 124 where N is incremented and another set of measurements, illustrated by boxes 126, through 132 are performed. When all reference voltages have been used, box 134 transfers control to box 136 where the current status of counter M is tested. If M is not at its maximum value, calibration data has not been stored on all of the ADCs, so box 136 directs the process to increment the value of M in box 138 and return to the input of box 114. The processes illustrated in boxes 114 through 136 are then undertaken for the next ADC. When box 136 determines that correction parameters have been computed for all ADCs at all reference voltages, control is transferred to box 140 where the process is declared complete.

Figure 6:
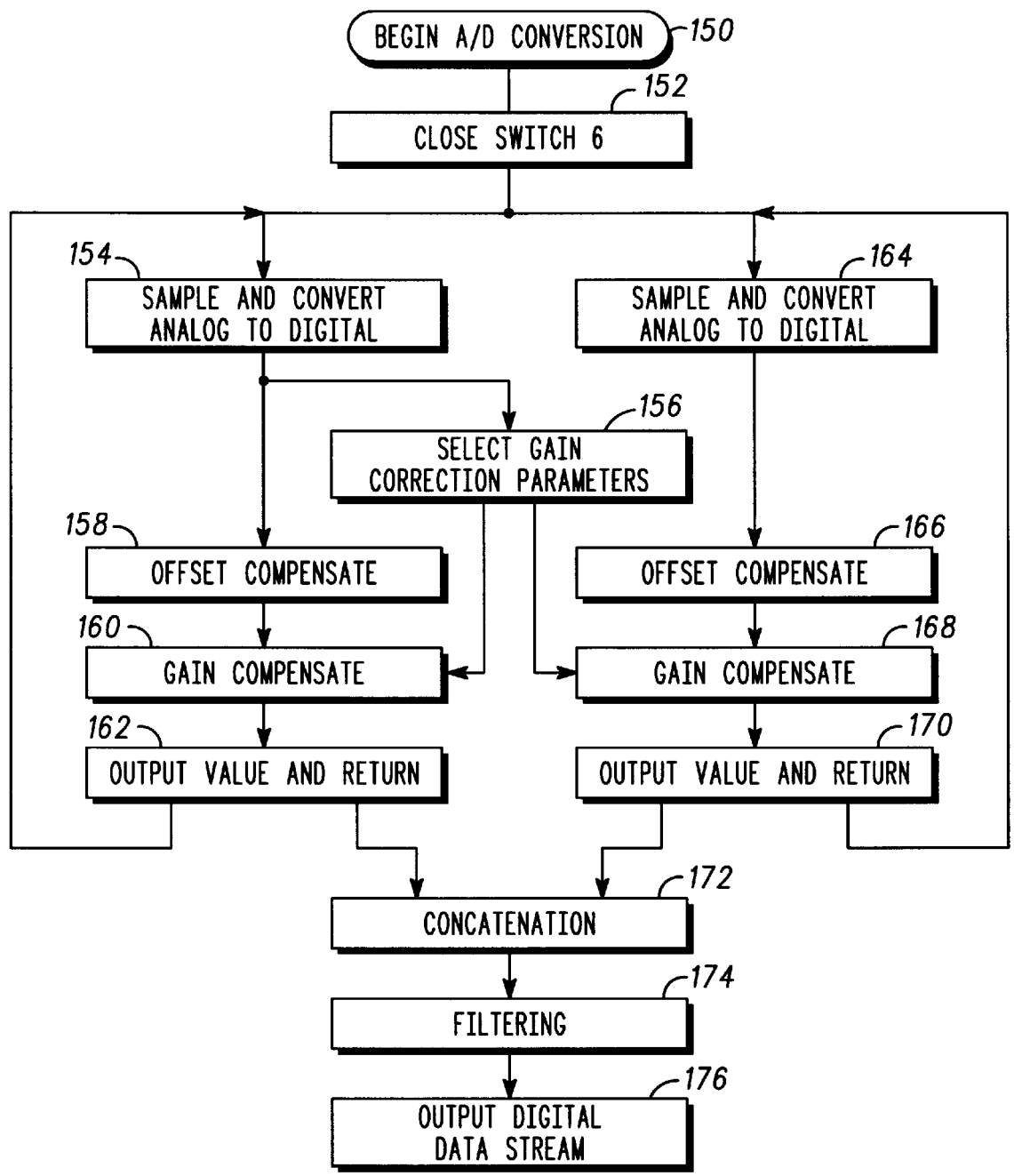
FIG. 6 is a flow chart of the A/D conversion process used in accordance with the present invention.

FIG. 6 is a flow chart illustration of the process of A/D conversion with corrections for the differences between the ADCs. The conversion process begins with box 150 which represents the receipt of a start conversion command from the associated digital processing system. In box 152, switch $S_6$ is closed in the input/output stage to supply the analog input signal 61 from an external source through the anti-aliasing filter 42 to the ADCs (ADCs 48 and 50 in FIG. 4). After box 152, the process flow splits into a plurality of similar paths with the first path having one additional connection. Box 154 in path one depicts the process in the first path ADC of taking a single sample of the analog signal and converting it to digital format. The resulting digital sample is routed to two locations; the control DSP 72 and digital adder 78. Box 156 identifies the process undertaken in the control DSP to select the appropriate gain correction parameters for all ADCs. Details of this selection process are provided in FIG. 7 and the associated paragraph below. In box 158, the offset in the digital signal sample is removed by summing the offset correction parameter for that ADC with the signal sample in a digital adder. In box 160, the gain error in the sample is removed by the process of multiplying the offset corrected sample by the gain correction parameter selected for that ADC in box 156. Box 162 depicts the process of outputting the corrected signal sample to the concatenator and returning control back to box 154 for another sample. Boxes 164, 166, 168 and 170 comprise the second path and perform the same processes as the corresponding boxes in the first path. The sample and convert analog to digital processes identified in boxes 154 and 164 occur at alternate times defined by the sampling clock signals 71 and 73 supplied to the ADCs. FIG. 6 depicts two paths related to the use of two ADCs and associated digital adders and multipliers. Those skilled in the art will recognize that these processes can be extended to a plurality of parallel paths greater than two, with proper phasing of the sampling clock signals and selection of the appropriate offset and gain correction parameters for each ADC. Box 172 identifies the process of receiving the signal samples in digital form at times defined by the sampling clock signals supplied to the ADCs and interleaving these digital data steams to form a composite data stream. In box 174 any noise and spurious signal components introduced by the conversion process are filtered out of the digital data stream before it is supplied to the associated digital signal processing circuits as depicted in box 176.

Figure 7:
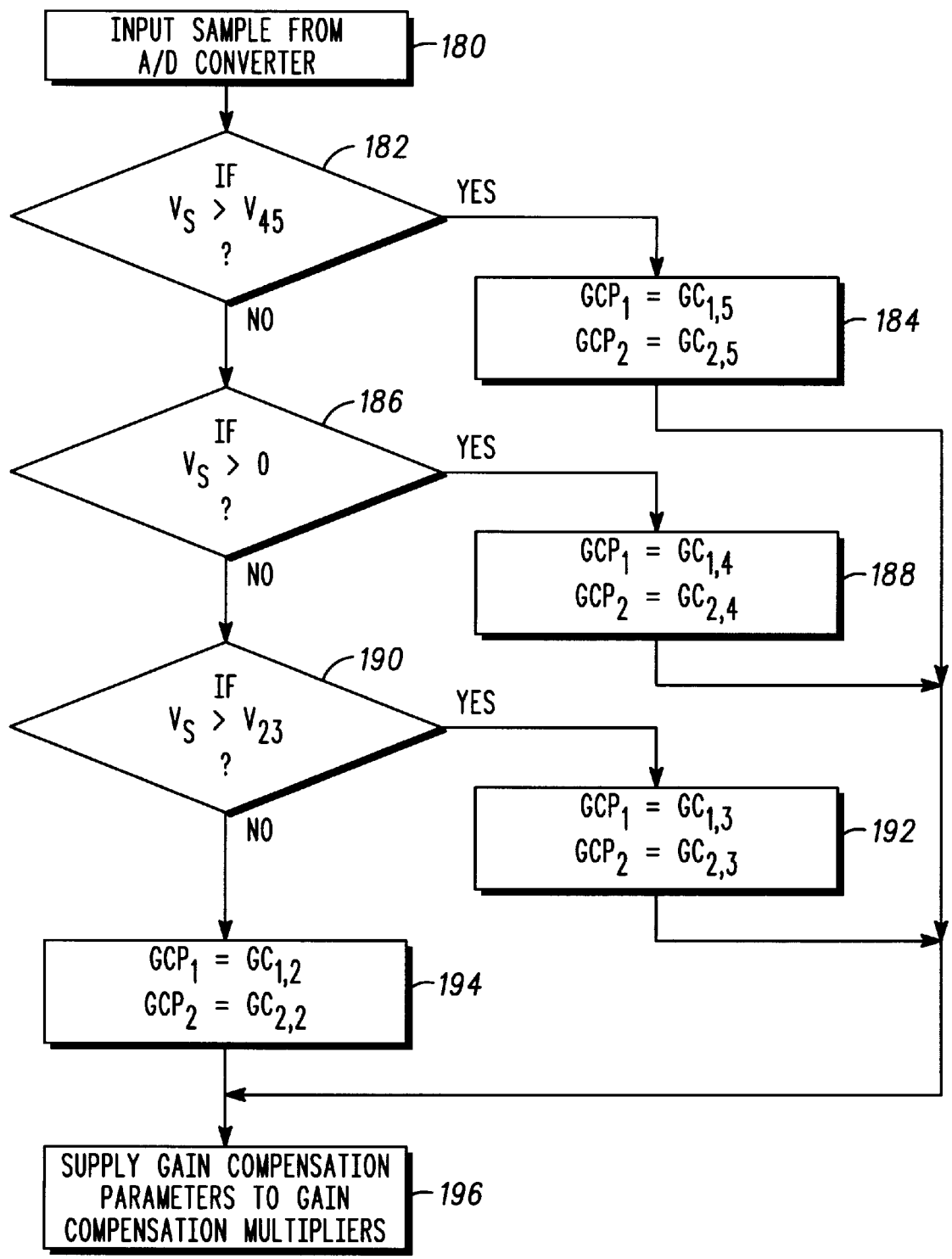
FIG. 7 is a flow chart of the process for selection of appropriate gain correction parameters for use in the A/D conversion process.

FIG. 7 illustrates the process that occurs in the select gain correction parameters box 156 of FIG. 6. During the calibration process defined in FIG. 5, gain correction parameters $GC_{M,N}$ were determined for each of a plurality of ADCs totaling M in number. These gain correction parameters were determined at N different reference voltages. For the preferred embodiment of the present invention, two positive value ($V_4$ and $V_5$) and two negative value ($V_2$ and $V_3$) reference voltages are used. When processing an inputted analog signal, the gain correction parameter derived from a reference voltage nearest in value to the instantaneous signal voltage should be used, and the purpose of the steps illustrated in FIG. 7 is to identify the correct gain correction parameter for each ADC. The process is based upon the use of break point voltages $V_{23}$ and $V_{45}$ which are defined by:

$$V_{23}=(V_2+V_3)/2$$

$$V_{45}=(V_4+V_5)/2$$

Box 180 of FIG. 7 illustrates the process of accepting a sample $V_s$ of the signal being converted which is then compared with breakpoint voltage $V_{45}$ in box 182. If $V_s$ is greater in value than $V_{45}$, then box 184 is invoked and the gain correction parameter $GCP_1$ for $ADC_1$ is set to be equal to $GC_{1,5}$ and parameter $GCP_2$ for $ADC_2$ is set to be equal to $GC_{2,5}$, thereupon the process is routed to box 196 where the GCPs are supplied to the gain compensation multipliers. If $V_s$ is not greater in value than $V_{45}$, then box 182 transfers the decision making process to box 186 where $V_s$ is checked to determine if it is greater than zero (has a positive value). If this test is passed, box 188 is invoked and its values for $GCP_1$ and $GCP_2$ are used. If $V_s$ is negative, then box 186 transfers the decision making process to box 190 where $V_s$ is checked to determine if it is greater than $V_{23}$. If this condition is true, box 192 is invoked and its values for $GCP_1$ and $GCP_2$ are used. If $V_s$ is more negative than $V_{23}$, then box 190 invokes box 194 for its values for $GCP_1$ and $GCP_2$. After the values for the GCPs are defined in any of the boxes 184, 188, 192, or 194, the process is routed to box 196 where the GCPs are supplied to the gain compensation multipliers as illustrated in FIG. 6.

Those skilled in the art will recognize that more or fewer calibration reference voltages, and/or different breakpoint voltages can be employed with attendant variations in the precision of the corrections to the gain responses of the ADCs. Further, those skilled in the art will recognize that if a plurality greater than two of ADCs are used, then the numbers of gain correction parameters will increase accordingly. Still further, those skilled in the art will recognize that many alternate methods of selection of the appropriate gain correction parameters also fall within the scope of the present invention.

The present invention has been described above with reference to a particular embodiment to facilitate teaching the invention. Those skilled in the art will recognize that many alternative embodiments, modifications and variations are apparent in light of the foregoing description. Accordingly, the invention is intended to embrace all such alternatives, modifications, and variations as fall within the spirit and broad scope of the appended claims.

We claim:

1. An apparatus for use in wide bandwidth analog to digital conversion, comprising:
    an input circuit for receiving an analog signal;
    a plurality of analog to digital converters, each having an input coupled to an output of said input circuit, wherein said plurality of analog to digital converters convert analog signals appearing at outputs of said plurality of analog to digital signals to digital signals; and
    a digital signal processor responsive to digital signals appearing at said outputs of said plurality of analog to digital converters, said digital signal processor including sum and multiplication means to apply offset and gain corrections to said digital signals and means for combining corrected digital signals at a single output.

2. An apparatus as claimed in claim 1, wherein said input circuit includes a plurality of reference voltages for calibrating the corrections to each output of said plurality of analog to digital converters.

3. An apparatus as claimed in claim 1, wherein said digital signal processor includes means to determine correction parameters for offset and gain for each of said plurality of analog to digital converters.

4. An apparatus as claimed in claim 1, wherein said digital signal processor includes means to apply phased sampling control signals to each of said plurality of analog to digital converters.

5. An apparatus as claimed in claim 1, wherein said digital signal processor includes means to interleave the corrected outputs of said plurality of analog to digital converters to form a single digital data signal thereby increasing the effective sampling rate of the apparatus.

6. An apparatus for use in wide bandwidth analog to digital and digital to analog conversion, comprising:
an input/output circuit for receiving and sending analog signals;
a plurality of analog to digital converters, each having an input coupled to an output of said input/output circuit, wherein said plurality of analog to digital converters convert analog signals appearing at outputs of said plurality of analog to digital signals to digital signals;
a digital to analog converter having an input and an output, said output of said digital to analog converter being coupled to said input/output circuit; and
a digital signal processor having an interface for receiving and sending digital signals, said digital signal processor having an output coupled to said input of said digital to analog converter, said digital signal processor being responsive to said digital signals appearing at said outputs of said plurality of analog to digital converters, said digital signal processor including sum and multiplication means to apply offset and gain corrections to said digital signals and means for combining corrected digital signals at a single digital output.

7. An apparatus as claimed in claim 6, wherein said input/output circuit includes a plurality of reference voltages for calibrating the corrections to each output of said plurality of analog to digital converters.

8. An apparatus as claimed in claim 6, wherein said digital signal processor includes means to determine correction parameters for and gain for each of said plurality of analog to digital converters.

9. An apparatus as claimed in claim 6, wherein said digital signal processor includes
means to apply phased sampling control signals to each of said plurality of analog to digital converters.

10. An apparatus as claimed in claim 6, wherein said digital signal processor includes means to interleave the corrected outputs of said analog to digital converters to form a single digital data signal thereby increasing the effective sampling rate of the apparatus.

11. A method for wide bandwidth analog to digital signal conversion comprising the steps of:
receiving an analog signal;
converting said analog signal to a plurality of digital signals;
applying offset and gain correction parameters to each of said plurality of digital signals to form a plurality of corrected digital signals; and
interleaving said plurality of corrected digital signals to form a single digital data signal.

12. A method as claimed in claim 11, wherein a plurality of said gain correction parameters for each of said plurality of digital signals is determined by the steps of:
periodically switching in place of said analog signal a known value reference voltage;
summing said offset correction parameter with each of said plurality of digital signals to form a plurality of offset corrected digital signals;
deriving each of said gain correction parameters by digitally dividing a digital word substantially equivalent to the value of said known value reference voltage by each of said plurality of offset corrected digital signals; and
storing in a memory each said gain correction parameters for use in correcting the gain of each of said plurality of offset corrected digital signals originating from said analog signal.

13. A method as claimed in claim 12 wherein the steps of periodically switching, summing, deriving and storing are performed for a plurality of known value reference voltages having positive and negative values.

14. A method as claimed in claim 13, wherein the step of applying offset and gain correction parameters includes the substeps of:
sampling one of said plurality of digital signals to determine a polarity and voltage range for that digital signal sample; and
selecting said gain correction parameters for each of said plurality of digital signals from said memory corresponding to one derived from one of the plurality of known value reference voltages closest in value to the digital signal sample.

15. A method as claimed in claim 11, wherein the step of applying offset and gain correction parameters to each of said plurality of digital signals includes the step of multiplying each of said plurality of offset corrected digital signals by a gain correction parameter.

16. A method as claimed in claim 15 wherein each of said gain correction parameters corresponds to a polarity and an amplitude range of said offset corrected digital signal.

17. A method as claimed in claim 11 wherein the step of converting said analog signal to a plurity of digital signals includes the step of filtering said analog signal to remove signal components outside a predetermined bandwidth.

18. A method as claimed in claim 11, wherein the step of converting said analog signal to a plurality of digital signals includes the step of sampling each of said plurality of digital signals with control signals having different phases.

19. A method as claimed in claim 11, wherein the step of applying offset and gain correction parameters to each of said plurality of digital signals includes the step of summing an offset correction parameter with each of said plurality of digital signals to form a plurality of offset corrected digital signals.

20. A method as claimed in claim 11, wherein the step of interleaving said plurality of corrected digital signals to form a single digital data signal includes the step of filtering the interleaved digital data signal to remove unwanted signal byproducts of conversion.

21. A method as claimed in claim 11, wherein said unique offset correction parameter for each of said plurality of digital signals is determined by the steps of:
periodically switching a reference voltage of substantially zero volts in place of said analog signal;

deriving said offset correction parameters by digitally subtracting each of said plurality of digital signals from a digital word representing zero volts; and storing in a memory said offset correction parameters for use in correcting the offset of each of said plurality of digital signals after each signal conversion.

22. A wide bandwidth analog to digital and digital to analog signal conversion apparatus to provide a two way interface between analog and digital domains, comprising:

an input/output circuit for receiving and supplying analog signals, and for supplying analog reference voltages for calibration of the analog to digital conversion;

a plurality of analog to digital converters coupled to said input/output circuit, said plurality of analog to digital converters being responsive to phased sampling control signals for converting said analog signals to corresponding digital data signals having an effective sampling rate substantially equal to a multiple of the rate for any one of said plurality of analog to digital converters;

a digital signal processor coupled to receive said digital data signals, said digital signal processor for determining the appropriate correction parameters to correct offset and gain errors in the outputs of said plurality of analog to digital converters, applying the correction parameters to said digital data signals, interleaving the corrected digital data signals from said plurality of analog to digital converters to form a single digital data signal, filtering of the interleaved digital data signal to remove undesired conversion byproducts, supplying the filtered digital data stream to said digital domain, receiving digital signals to be converted to analog signals, and controlling the analog to digital and digital to analog conversion processes in response to control signals from said digital domain; and a digital to analog converter coupled to said digital signal processor and to said input/output circuit for converting digital data signals to analog signals.

* * * * *